(12) United States Patent
Fiedler

(10) Patent No.: US 12,255,655 B2
(45) Date of Patent: Mar. 18, 2025

(54) CLOCK MONITOR

(71) Applicant: Microsoft Technology Licensing, LLC, Redmond, WA (US)

(72) Inventor: Alan Scott Fiedler, Santa Barbara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 458 days.

(21) Appl. No.: 17/344,775

(22) Filed: Jun. 10, 2021

(65) Prior Publication Data

US 2022/0407506 A1 Dec. 22, 2022

(51) Int. Cl.
*H03K 5/24* (2006.01)
*G01R 31/08* (2020.01)
*G06F 1/08* (2006.01)
*H03K 5/00* (2006.01)

(52) U.S. Cl.
CPC .............. *H03K 5/24* (2013.01); *G01R 31/088* (2013.01); *G06F 1/08* (2013.01); *H03K 2005/00078* (2013.01)

(58) Field of Classification Search
CPC ........... H03K 5/24; H03K 2005/00078; G01R 31/088; G06F 1/08
See application file for complete search history.

(56) References Cited

U.S. PATENT DOCUMENTS

| | | | | |
|---|---|---|---|---|
| 5,099,153 A | * | 3/1992 | Adams | G06F 1/04 327/292 |
| 6,272,439 B1 | * | 8/2001 | Buer | G01R 23/175 327/158 |
| 7,071,746 B2 | * | 7/2006 | Suda et al. | G01R 31/31922 327/158 |
| 7,251,305 B2 | | 7/2007 | Gauthier et al. | |

(Continued)

FOREIGN PATENT DOCUMENTS

| | | | | |
|---|---|---|---|---|
| CN | 101478300 B | | 9/2010 | |
| EP | 0264691 B1 | * | 7/1993 | G05F 1/466 |

OTHER PUBLICATIONS

"Intel® Arria® 10 Hard Processor System Technical Reference Manual", Retrieved from: https://www.intel.la/content/dam/www/programmable/us/en/pdfs/literature/hb/arria-10/a10_5v4.pdf, Jan. 21, 2021, pp. 1-739.

(Continued)

*Primary Examiner* — Lincoln D Donovan
*Assistant Examiner* — James G Yeaman
(74) *Attorney, Agent, or Firm* — Ogilvie Law Firm

(57) ABSTRACT

A clock monitor circuit detects departures from expected values for clock period, clock high time duration, or clock low time duration. A delay line of the clock monitor circuit is composed of delay portions of delay cells. Each delay cell also has a comparator portion with logic to compare aspects of the monitored clock signal to corresponding expected values, and to output a failure detection signal indicating (Continued)

whether the expected values are met. Expected values may be read from a fuse set. The delay of the delay line may be programmatically adjusted. The clock monitor circuit may be combined with a circuit that detects narrow glitches in the monitored clock signal. Devices and systems with one or more monitored clock signals, and methods of clock signal monitoring, are also described.

20 Claims, 9 Drawing Sheets

(56) References Cited

U.S. PATENT DOCUMENTS

| | | | |
|---|---|---|---|
| 7,308,065 B2 | 12/2007 | Donnelly et al. | |
| 7,372,311 B2 | 5/2008 | Kang | |
| 7,436,718 B2 * | 10/2008 | Tanaka | G11C 17/18 |
| | | | 365/201 |
| 7,454,645 B2 | 11/2008 | Li et al. | |
| 8,736,329 B1 * | 5/2014 | Rajavi | H03K 5/1565 |
| | | | 327/175 |
| 8,878,582 B2 | 11/2014 | Hsueh et al. | |
| 8,937,496 B1 * | 1/2015 | Ahmad | H03K 5/19 |
| | | | 327/39 |
| 9,515,648 B2 * | 12/2016 | Chi | G06F 1/24 |
| 10,277,213 B1 * | 4/2019 | Kimelman | H03K 5/1252 |
| 10,840,281 B2 * | 11/2020 | Chou | H04N 5/378 |
| 10,901,020 B2 * | 1/2021 | Jain | G01R 31/31727 |
| 2004/0027185 A1 | 2/2004 | Fiedler | |
| 2004/0150420 A1 | 8/2004 | Fiedler | |
| 2004/0160265 A1 | 8/2004 | Fiedler | |
| 2005/0174148 A1 | 8/2005 | Fiedler | |
| 2005/0174160 A1 | 8/2005 | Fiedler | |
| 2005/0221785 A1 | 10/2005 | Fiedler | |
| 2005/0231247 A1 * | 10/2005 | Cho | H03L 7/0816 |
| | | | 327/158 |
| 2007/0006054 A1 | 1/2007 | Fiedler | |
| 2007/0075758 A1 | 4/2007 | Fiedler | |
| 2007/0188207 A1 | 8/2007 | Fiedler | |
| 2007/0205818 A1 | 9/2007 | Fiedler | |
| 2007/0230618 A1 | 10/2007 | Fiedler | |
| 2007/0236220 A1 | 10/2007 | Hinck et al. | |
| 2008/0054969 A2 | 3/2008 | Fiedler | |
| 2008/0079463 A1 | 4/2008 | Wadhwa et al. | |
| 2008/0204155 A1 * | 8/2008 | Olmos | H03K 3/354 |
| | | | 331/108 R |
| 2009/0322388 A1 | 12/2009 | Fiedler | |
| 2010/0052744 A1 | 3/2010 | Fiedler | |
| 2011/0025518 A1 | 2/2011 | Huang | |
| 2013/0002300 A1 | 1/2013 | Fiedler | |
| 2013/0007500 A1 | 1/2013 | Fiedler | |
| 2014/0354264 A1 * | 12/2014 | Turullols | G01R 19/2503 |
| | | | 324/113 |
| 2014/0372785 A1 | 12/2014 | Fiedler | |
| 2015/0033061 A1 | 1/2015 | Yu et al. | |
| 2016/0065196 A1 | 3/2016 | Fiedler | |
| 2016/0218753 A1 | 7/2016 | Fiedler | |
| 2016/0218896 A1 | 7/2016 | Fiedler | |
| 2016/0248608 A1 | 8/2016 | Fiedler | |
| 2017/0053710 A1 | 2/2017 | Rohleder et al. | |
| 2017/0255223 A1 | 9/2017 | Bansal et al. | |
| 2018/0091125 A1 | 3/2018 | Carlson et al. | |
| 2018/0226978 A1 | 8/2018 | Fiedler | |
| 2019/0198072 A1 | 6/2019 | Park et al. | |
| 2020/0073460 A1 * | 3/2020 | Lee | G06F 1/324 |
| 2020/0235726 A1 | 7/2020 | Naidorf et al. | |

OTHER PUBLICATIONS

"Clock signal", retrieved from <<https://en.wikipedia.org/wiki/Clock_signal>>, Mar. 5, 2021, 5 pages.

"Clock generator", retrieved from <<https://en.wikipedia.org/wiki/Clock_generator>>, Oct. 31, 2020, 2 pages.

"Differential nonlinearity", retrieved from <<https://en.wikipedia.org/wiki/Differential_nonlinearity>>, Oct. 10, 2020, 2 pages.

Raúl Jiménez-Naharro, "A Smart Sensor for Defending against Clock Glitching Attacks on the I2C Protocol in Robotic Applications", Mar. 25, 2017., retrieved from <<https://www.ncbi.nlm.nih.gov/pmc/articles/PMC5419790/>>, 24 pages.

Thomas Korak, et al., "On the Effects of Clock and Power Supply Tampering on Two Microcontroller Platforms", retrieved from <<https://ieeexplore.ieee.org/document/6976627>>, 2014, 3 pages.

"International Search Report and Written Opinion Issued in PCT Application No. PCT/US22/028652", Mailed Date: Aug. 31, 2022, 13 Pages.

* cited by examiner

DELAY CELLS 312, DELAY CELL ELEMENT 502

CLOCK MONITOR

BACKGROUND

Noon Many electronic devices use a clock signal to coordinate activities in digital circuits. Clock signals are produced by a clock generator. Although variations exist, a clock signal often takes the form of a square wave with a constant frequency. Circuits and individual components that use the clock signal for synchronization may be activated at a leading edge of the clock signal, at a falling edge, or at each edge. A clock signal may be multiplied, e.g., to match a processor clock rate that is faster than the clock rate of other components. A clock distribution network, such as a clock tree, distributes one or more clock signals throughout a group of components and circuits.

SUMMARY

Some embodiments described herein provide a clock monitor circuit for detecting departures from expected values for period, high time duration, or low time duration in a clock signal. A delay line is composed of delay portions of delay cells. Each delay cell also has a comparator portion with logic to compare aspects of the monitored clock signal to corresponding expected values, and to output a failure detection signal indicating whether the expected values are met. The clock monitor circuit may be combined with a circuit that detects narrow glitches in the monitored clock signal. Devices and systems with one or more monitored clock signals, and methods of clock signal monitoring, are also described.

Other technical activities and characteristics pertinent to teachings herein will also become apparent to those of skill in the art. The examples given are merely illustrative. This Summary is not intended to identify key features or essential features of the claimed subject matter, nor is it intended to be used to limit the scope of the claimed subject matter. Rather, this Summary is provided to introduce—in a simplified form—some technical concepts that are further described below in the Detailed Description. The innovation is defined with claims as properly understood, and to the extent this Summary conflicts with the claims, the claims should prevail.

DESCRIPTION OF THE DRAWINGS

A more particular description will be given with reference to the attached drawings. These drawings only illustrate selected aspects and thus do not fully determine coverage or scope.

DETAILED DESCRIPTION

Overview

Innovations may expand beyond their origins, but understanding an innovation's origins can help one more fully appreciate the innovation. In the present case, some teachings described herein were motivated by the experiences of a Microsoft innovator who recognized and faced technical challenges arising from an effort to improve the security of video gaming systems and other systems and devices against attacks that involve tampering with clock signals.

A modern device or system often contains licensing status, encryption keys, financial information, personal information, and other data which should be secured against improper access and unauthorized use. Such critical data may be stored, for example, in an SOC (system on a chip) in a video gaming system. "IP" is intellectual property, and also refers to the technology artifacts and the techniques it helps protect. Security IP is designed and implemented to secure critical data.

But producing viable security IP is challenging for many reasons. One challenge is posed by the wide range of possible attacks. An answer to that challenge is to provide defense-in-depth which does not rely entirely on any single defense mechanism but instead combines and layers defenses. The clock monitor teachings discussed herein help prevent attacks that involve tampering with clock signals, and may be combined with other security mechanisms to help provide defense-in-depth.

Another technical challenge is how to provide effective security using circuitry that is manufacturable as in-place (on the die) logic, and accordingly has acceptably low power requirements, a small footprint, and manageable temperature-dependent characteristics. Clock monitor circuits taught herein satisfy those criteria.

Another technical challenge is how to provide flexibility for handling variations in clock characteristics. Clock monitor circuit delay cells taught herein may be combined in various numbers to obtain different sampling distributions, and different expected values may be used by different instances of the clock monitor circuit. Moreover, the clock monitor circuit may be supplemented by a circuit taught herein that detects narrow glitches in the monitored clock signal.

These and other technical challenges will be apparent to one of skill in the art upon study of the present disclosure, as will the solutions and advantages that are offered by the circuits and methods taught herein.

Operating Environments

Figure 1:
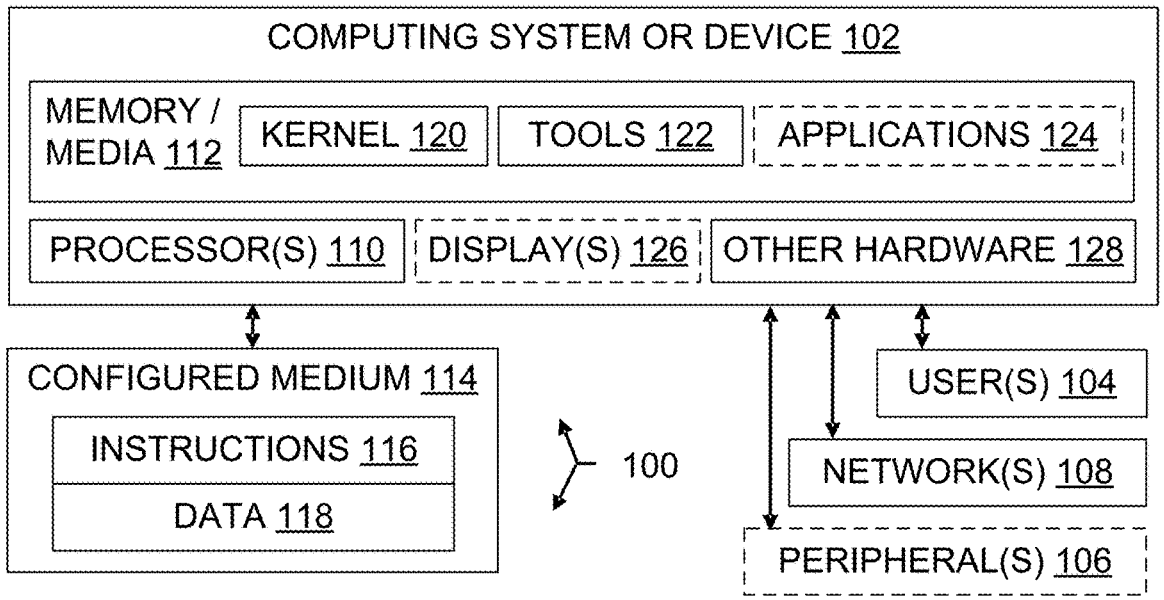
FIG. 1 is a block diagram illustrating computer systems and devices generally.

With reference to FIG. 1, an operating environment 100 for an embodiment includes at least one computer system or device 102. The computer system or device 102 may have multiple processors. An operating environment may include one or more machines in a given computer system, which may be clustered, client-server networked, and/or peer-to-peer networked within a cloud. An individual machine is a computer system or device, and a network or other group of cooperating machines is also a computer system. A given computer system or device 102 may be configured for end-users, e.g., with applications, for administrators, as a server, as a distributed processing node, and/or in other ways.

Human users 104 may interact with the computer system or device 102 by using displays, keyboards, and other peripherals 106, via typed text, touch, voice, movement, computer vision, gestures, and/or other forms of I/O. A screen or other display 126 may be a removable peripheral 106 or may be an integral part of the system or device 102. A user interface may support interaction between an embodiment and one or more human users. Storage devices and/or networking devices may be considered peripheral equipment in some embodiments and part of a system 102 in other embodiments, depending on their detachability from the processor 110. Other computer systems or devices not shown in FIG. 1 may interact in technological ways with the computer system or device 102 or with another embodiment using one or more connections to a network 108 via network interface equipment, for example.

Each computer system or device 102 includes at least one processor 110. Some also include one or more computer-readable storage media 112. Storage media 112 may be of different physical types. The storage media 112 may be volatile memory, nonvolatile memory, fixed in place media, removable media, magnetic media, optical media, solid-state media, and/or of other types of physical durable storage media (as opposed to merely a propagated signal or mere energy). The removable configured storage medium 114 is an example of a computer-readable storage medium 112. Some other examples of computer-readable storage media 112 include built-in RAM, ROM, hard disks, and other memory storage devices which are not readily removable by users 104. For compliance with current United States patent requirements, neither a computer-readable medium nor a computer-readable storage medium nor a computer-readable memory is a signal per se or mere energy under any claim pending or granted in the United States. Any claim interpretation to the contrary is not reasonable.

The storage medium 114 is configured with binary instructions 116 that are executable by a processor 110; "executable" is used in a broad sense herein to include machine code, interpretable code, bytecode, and/or code that runs on a virtual machine, for example. The storage medium 114 is also configured with data 118 which is created, modified, referenced, and/or otherwise used for technical effect by execution of the instructions 116.

An embodiment may be implemented as hardware, as firmware or other software instructions, or as a mixture. One of skill will understand that the same or similar functionality can often be implemented, in whole or in part, directly in hardware logic, or in firmware, to provide the same or similar technical effects. For example, and without excluding other implementations, an embodiment may include hardware logic components 110, 128 such as Field-Programmable Gate Arrays (FPGAs), Application-Specific Integrated Circuits (ASICs), Application-Specific Standard Products (ASSPs), System-on-a-Chip components (SOCs), Complex Programmable Logic Devices (CPLDs), and similar components. Components of an embodiment may be grouped into interacting functional modules based on their inputs, outputs, and/or their technical effects, for example.

In addition to processors 110 (e.g., CPUs, ALUs, FPUs, TPUs and/or GPUs), memory/storage media 112, and displays 126, an operating environment may also include other hardware 128, such as batteries, buses, power supplies, wired and wireless network interface cards, for instance. A display 126 may include one or more touch screens, screens responsive to input from a pen or tablet, or screens which operate solely for output. In some embodiments, peripherals 106 such as human user I/O devices (screen, keyboard, mouse, tablet, microphone, speaker, motion sensor, etc.) will be present in operable communication with one or more processors 110 and memory.

In some embodiments, a system 102 includes multiple computers connected by a wired and/or wireless network 108. Networking interface equipment 128 can provide access to networks 108, using network components such as a packet-switched network interface card, a wireless transceiver, or a telephone network interface, for example, which may be present in a given computer system. A given embodiment may also communicate technical data and/or technical instructions through direct memory access, removable nonvolatile storage media, or other information storage-retrieval and/or transmission approaches.

One of skill will appreciate that the foregoing aspects and other aspects presented herein under "Operating Environments" may form part of a given embodiment. This document's headings are not intended to provide a strict classification of features into embodiment and non-embodiment feature sets.

One or more items are shown in outline form in the Figures, or listed inside parentheses, to emphasize that they are not necessarily part of the illustrated operating environment or all embodiments, but may interoperate with items in the operating environment or some embodiments as discussed herein. It does not follow that items not in outline or parenthetical form are necessarily required, in any Figure or any embodiment. In particular, FIG. 1 is provided for convenience; inclusion of an item in FIG. 1 does not imply that the item, or the described use of the item, was known prior to the current innovations.

More About Systems and Devices

Figure 2:
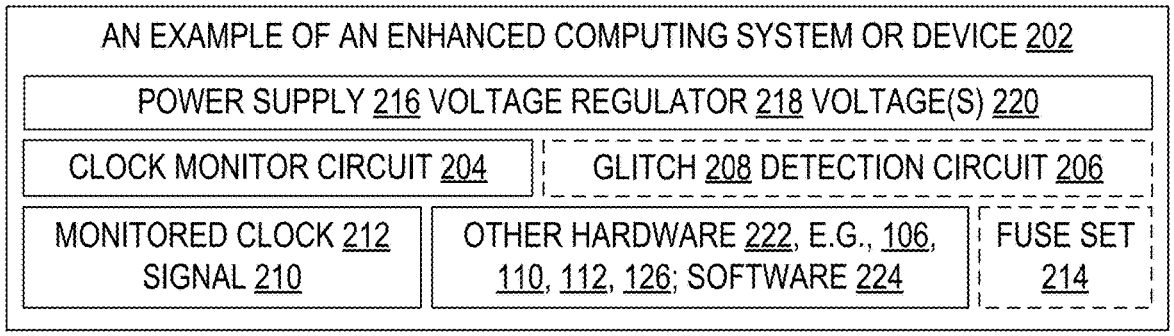
FIG. 2 is a block diagram illustrating aspects of a computing system or device which has one or more clock monitoring enhancements.

FIG. 2 illustrates a computing system or device 102 that is configured by one or more of the clock monitoring enhancements taught herein, resulting in an enhanced system or device 202. Two of the possible enhancements are a clock monitor circuit 204 and a circuit 206 for detecting narrow glitches 208 in a monitored clock signal 210. The monitored clock signal 210 is generated by a clock 212, which may be a clock generator, a timing-signal generator, or another component having a resonant circuit and amplifier, for example. In some embodiments, the enhancements include a fuse set 214 which has been configured with values that are used by the clock monitor circuit 204 per se as reference values to detect departure from acceptable clock signal behaviors.

The illustrated computing system or device 202 also includes a power supply 216. Power regulation 218 provides one or more voltages 220 to the clock monitor circuit 204 or the glitch detection circuit 206 or both.

In addition, a wide variety of software 224 may be present, such as a kernel 120, application programs 124, and diagnostic or other tools 122. In particular, the software 224 may include video gaming software, such as Microsoft Xbox® software (mark of Microsoft Corporation). General-purpose hardware 222, and special-purpose video gaming hardware 222 may likewise be present, including processors 110, memory 112, displays 126, and other hardware. Some or all of the hardware 222 may utilize one or more monitored clock signals 210. Unmonitored clock signals may also be present in a system or device 202; there is no requirement here that all clock signals be monitored.

Figure 3:
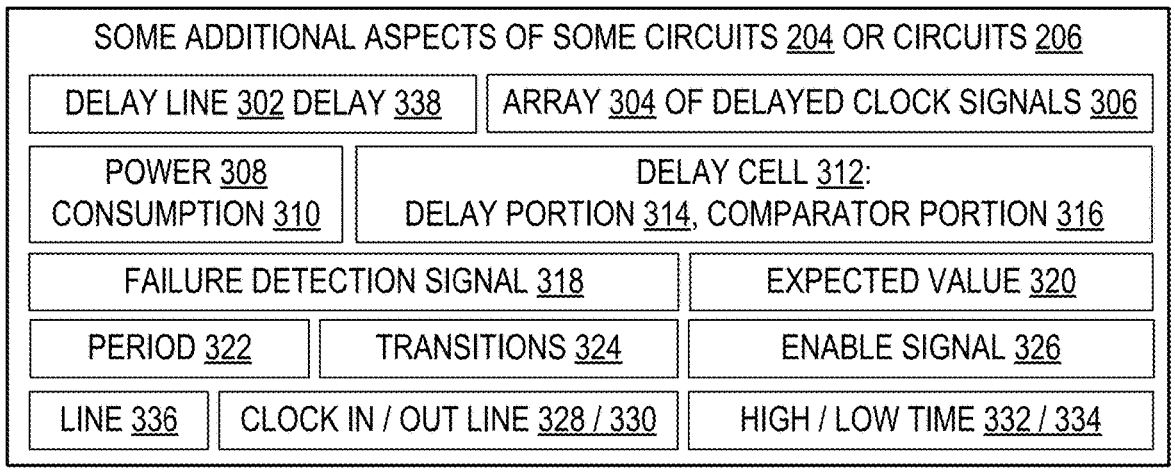
FIG. 3 is a block diagram illustrating some additional aspects of some clock monitor circuits.

FIG. 3 shows some additional aspects of clock monitor circuits 204 or glitch detection circuits 206 or both, in some embodiments. This is not a comprehensive summary of all circuit 204 or circuit 206 aspects. These FIG. 3 items are discussed at various points herein, and additional details regarding them are provided in the discussion of a List of Reference Numerals later in this disclosure document.

Figure 4:
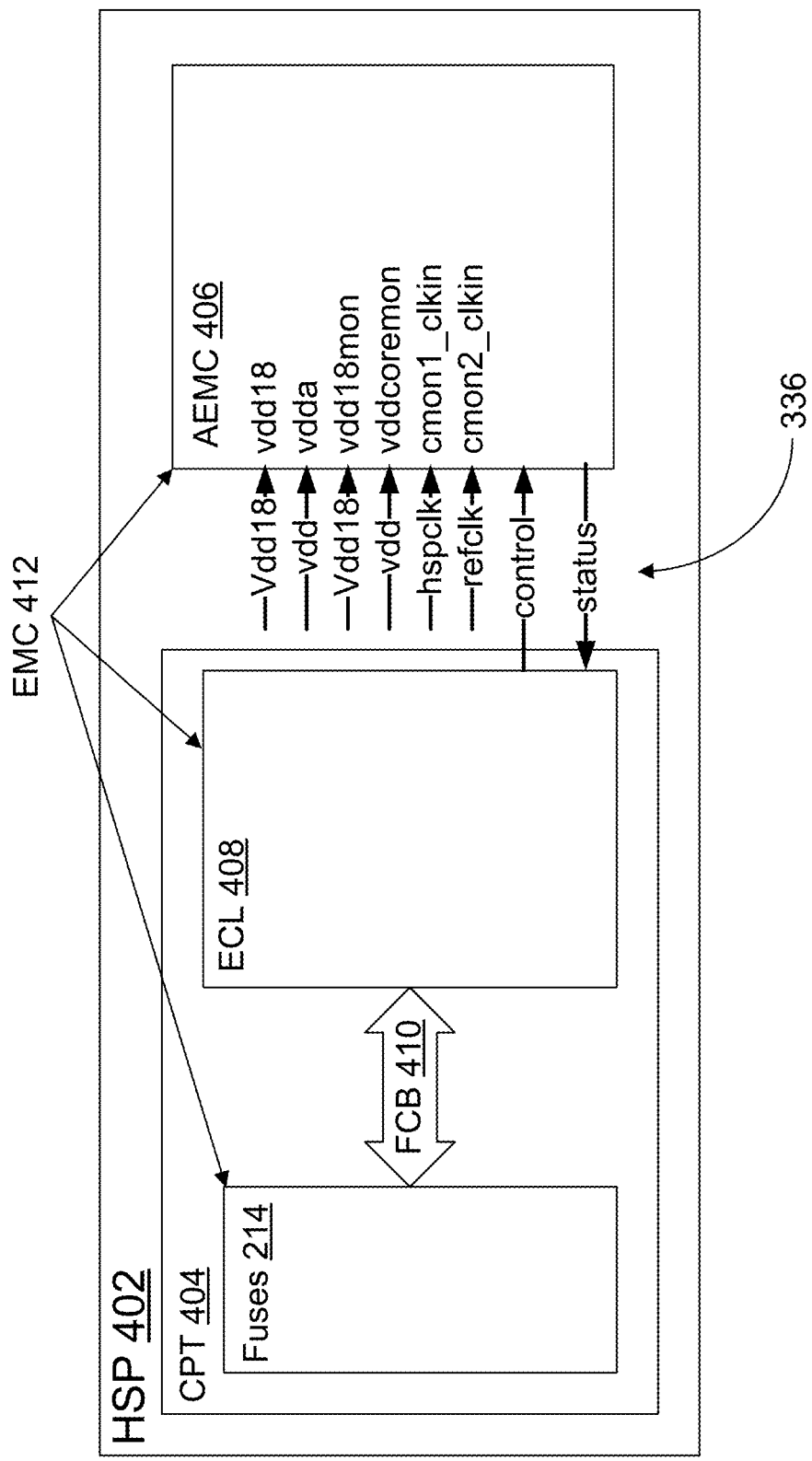
FIG. 4 is an architecture diagram illustrating a hardware security platform (HSP) which includes a clock monitor circuit.

FIG. 4 shows an architecture diagram of one of the many possible operating environments of clock monitor enhancement functionality. A Hardware Security Platform (HSP) 402 includes a security component (CPT) 404 and an Analog Environmental Monitor Circuit (AEMC) 406. The CPT 404 includes a fuse set 214 and an EMC Control Logic (ECL) 408 which communicate via Fuse Communication Bus 410. Various signal lines 336 are also present; for information about signal line 336 names, refer to the section below on abbreviations and acronyms.

In this example, an Environmental Monitor Circuit (EMC) 412 monitors select clocks and power supplies and takes specific action upon detection of a clock period failure, high time failure, or low time failure against calibrated limits, or a power supply voltage failure against calibrated limits. The EMC 412 resides in the HSP block 402 and includes the ECL 408 and associated fuses 214 in the CPT 404, as well as the AEMC 406, which is a minion of the ECL 408.

In this example, the ECL 408 is the digital control logic for AEMC 406. The ECL 408 manages communication with the AEMC, the CPT, the HSP and the fuse bank that holds AEMC calibration information.

In this example, the AEMC includes full-custom analog circuitry to monitor temperature, power supply voltage, and clock behavior aspects that include period, high time, and low time. These monitors are called the TMON, VMON and CMON, respectively, and are calibrated during production test. Calibration values are stored in fuses. However, other voltage monitors or temperature monitors may also be part of an environmental monitor, including for example conventional voltage monitors or temperature monitors.

Figure 5:
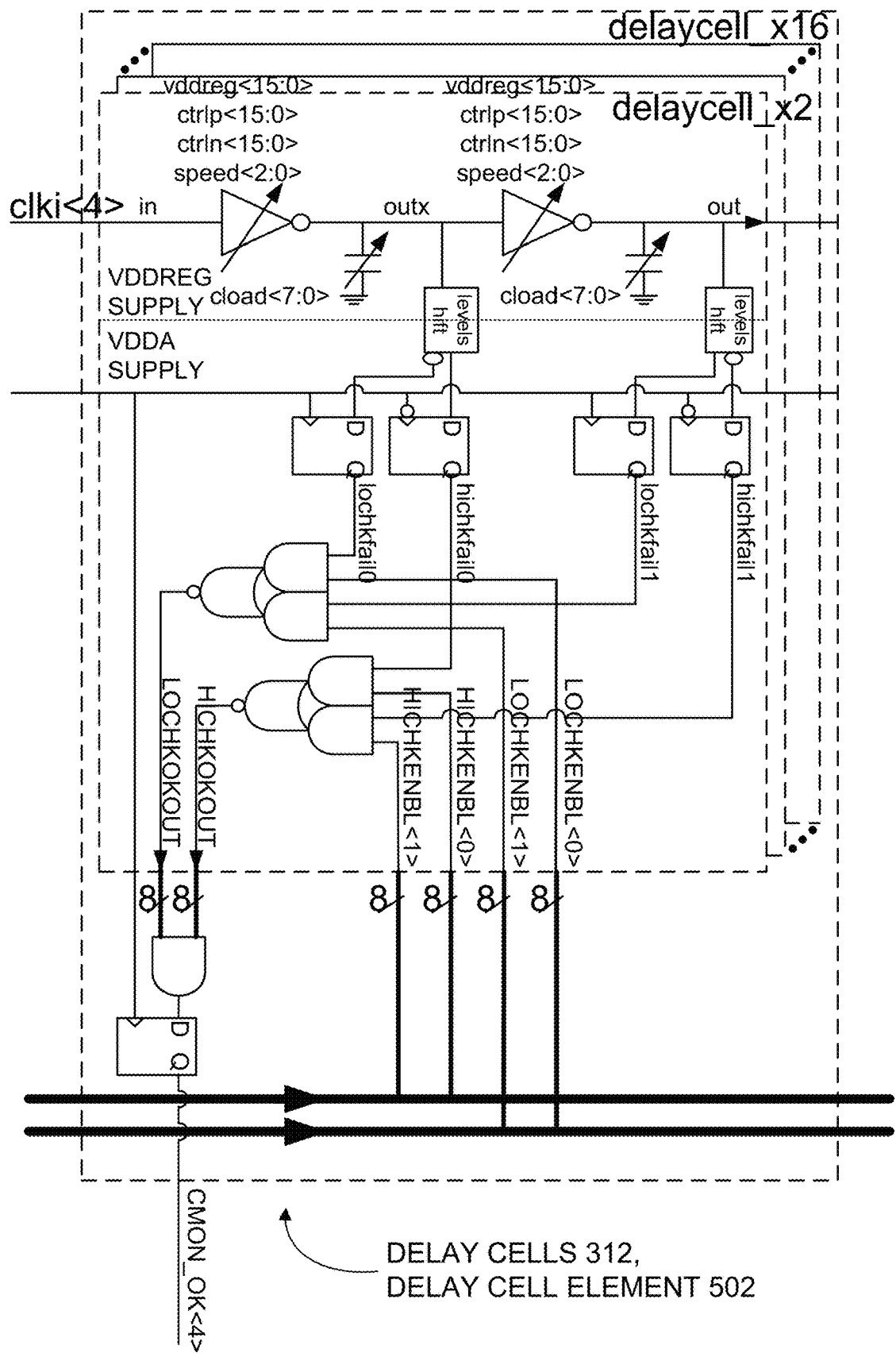
FIG. 5 is a circuit diagram illustrating delay cells.
Figure 6:
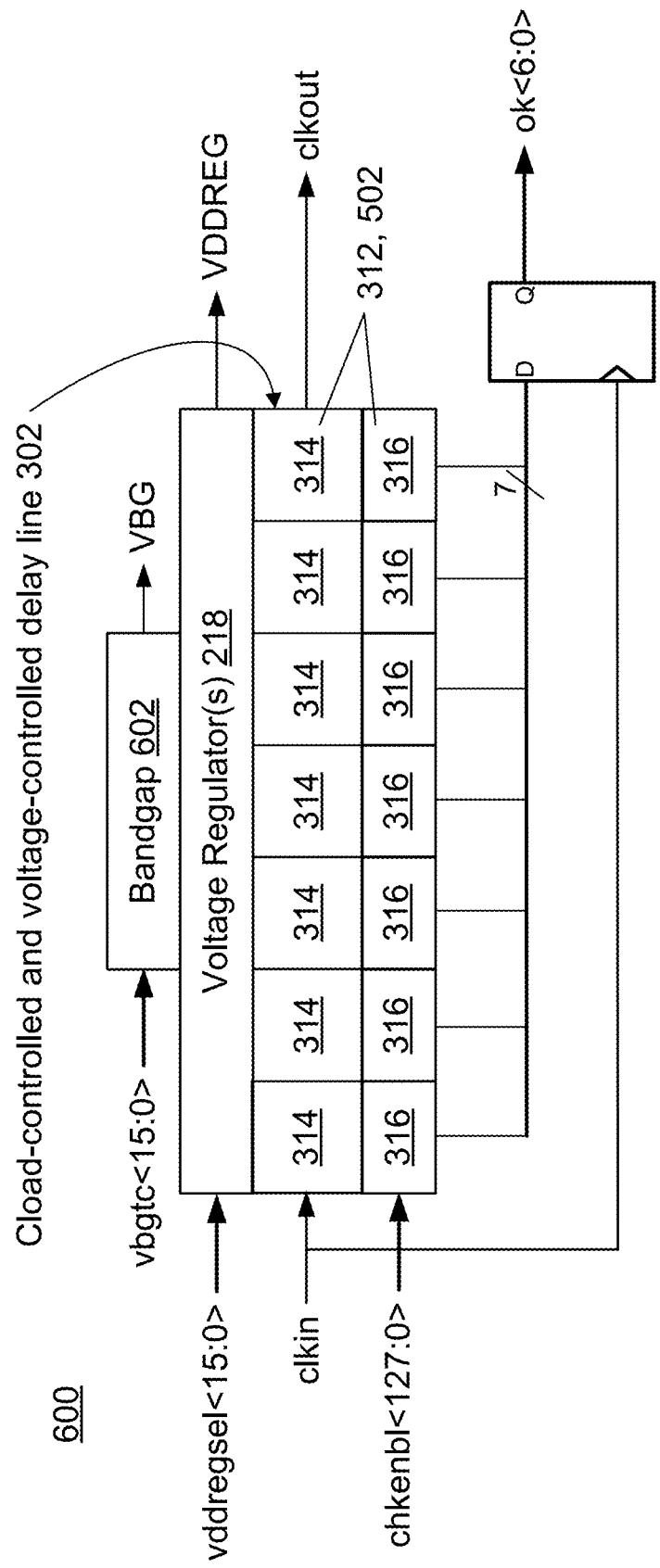
FIG. 6 is a schematic diagram illustrating a clock monitor circuit with delay cells arranged in a delay line and with voltage regulation.
Figure 11:
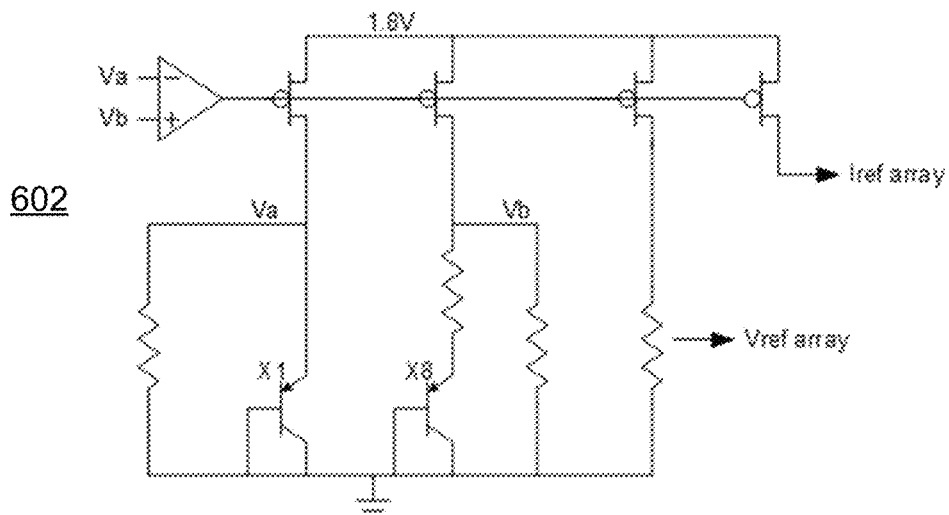
FIG. 11 is a bandgap schematic.

FIG. 11 shows a simplified bandgap schematic. A resistor ladder coupled to each monitored voltage generates monitor ladder voltages having nominally 10 mV steps. For each monitored voltage, analog multiplexers programmatically couple a reference ladder voltage and a first monitor ladder voltage to a high trip comparator, and analog multiplexers programmatically couple the reference ladder voltage and a second monitor ladder voltage to a low trip comparator. Whenever the monitored voltage is greater than a programmed high-trip voltage threshold, the high trip comparator output signal will go low, and this event is captured and acted upon by the ECL. Whenever the monitored voltage is less than a programmed low-trip voltage threshold, the low trip comparator output signal will go low, and this event is captured and acted upon by the ECL. In this example, there are two Clock Monitors (CMONs), along with glitch detection circuit 206. FIGS. 5 and 6 show examples of CMON delay cells 312 and a CMON 600 built with delay cells 312. A 112-stage delay line generates, from a monitored clock signal 210, delayed clock signals 306 having transitions 324 that are evenly distributed in time across the monitored clock's period 322. Stages correspond to delay cells 312. Other examples may have a different number of stages.

These time-distributed clock signals 306 are sampled by the clock monitor 600, and each clock signal sample is tested against an expected value 320 (high, low, or don't care) that has been stored in a fuse 214. The "don't care" value may be understood as meaning that no particular value is expected. When a test results in failure, a corresponding ok bit is de-asserted for one cycle of the monitored clock 212, and this event is captured and acted upon by the ECL 408. Setting the delay line's delay 338 is done during production calibration to match the period of a calibration reference clock that has a duty cycle of 50% and period equal to the monitored clock 212 nominal period. Determination and fusing of the expected values 320 for the clock signal samples (high, low, or don't care) is also done during production calibration to calibration clocks that exhibit the target minimum and maximum high time, low time, and period. At the end of the calibration sequence, calibration values are written to fuses 214.

In this example, there are also a bandgap reference 602 and voltage regulators 218. The bandgap provides approximately temperature-independent reference currents used by the CMONs. In some embodiments, the clock monitor circuit receives a controlled voltage from a bandgap voltage supply. In some, the bandgap provides a direct voltage. In a present embodiment, the bandgap generates a voltage from a current directed through a resistor.

In this example, the AEMC is powered by 1.8V and 0.8V supplies. Most of its power 308 is drawn from the 1.8V supply, and less than 10% is drawn from the 0.8V supply. Power scales proportionately with power supply voltage and monitored clock frequency. Power is largely independent of process and temperature due to bandgap referencing. Power consumption at process voltage temperature PVT=TT, Vdd=1.8V, T=600 may include the following:

1 bandgap 0.261 mW
2 CMON regulators 0.088 mW each
200 MHz CMON 0.275 mW
750 kHz CMON 0.041 mW In this example, the AEMC circuitry has a small number of timing requirements, and these are managed by the ECL. Signals between ECL and AEMC are largely asynchronous, and for those that are synchronous, there is no specific setup or hold time requirement. A period of time is used for the AEMC to settle after a calibration value is changed. When a calibration value is updated, the ECL is designed to ignore the ok status reported by the AEMC for at least two periods of the slowest clock being monitored. The AEMC CMON ok output status signals update in real-time as the monitored parameters (e.g., period, high time and low time) vary. For the CMON, a trip duration will last for 1-2 clock cycles. The ECL will latch AEMC status and retain a trip event indicated by a low ok signal from the AEMC until this latched status in the ECL is cleared by the ECL.

FIG. 5 is a circuit diagram illustrating delay cells 312. FIG. 6 is a schematic diagram illustrating a clock monitor circuit 204 with delay cells 312 arranged in a delay line 302 and with voltage regulation 218. Each delay cell 312 includes a delay portion 314 and a comparator portion 316.

In this example, a CMON Analog Behavioral Model (ABM) has been derived largely from the CMON circuit schematic of FIGS. 5 and 6, with an exception that the delay 338 of a stage 314 of the CMON's delay line 302 is calculated from an equation whose coefficients are determined by fitting the equation to delay measurements obtained from simulation. The equation and its fitted constants at nominal PV are shown in Equation 1 and Table 1.

$$stagedelay\text{(ns)} = \left(\frac{273}{\text{temperature (° C.)} + a9}\right) \quad \text{Formula (1)}$$

$$\left(a3 + a4\frac{(4*cloadmsb + cloadlsb + a5)(tempco + a6)}{(vddreg + a8)(ctrlpn + a7)}\right)$$

TABLE 1

| constant | cmon1_speed[2:0] = '001 (freq = 750 kHz) | cmon2_speed[2:0] = '100 (freq = 200 MHz) |
|---|---|---|
| a3 | 0.5359 | 0.0488 |
| a4 | 61.1431 | 3.0815 |
| a5 | 12.3064 | 12.0792 |
| a6 | 33.1599 | 42.0528 |
| a7 | 78.7597 | 285.2204 |
| a8 | 0.9956 | 1.0330 |
| a9 | 1412.3604 | 3300.3943 |

In the FIG. 6 example, seven delaycell_x16 elements 502 are instantiated in series, giving a 112-stage delay line in total. With the benefit of teachings herein, the delay line 302 may be viewed as analogous to a voltage ladder used to generate an array of voltages spanning a range, but the delay line 302 instead provides a time ladder generating an array of clock edges 324 spanning a range.

In this example, combinatorial logic 316 at each delay element effectively samples the monitored clock's n/112 (n=0, 1, 2, . . . , 111) clock period fractions after the monitored clock's rising and falling edges, and compares 1208 the clock's state (high or low) at those times against the expected state 320 (high, low, or don't care). Detected compare failures are then aggregated onto the cmon_ok<5:0> output signals.

In this example, delay line delay 338 is digitally controlled, and these controls are fuse programmed during calibration, e.g., in production test. Delay controls are tuned during calibration to set an aggregate 96-element delay line's delay equal to a calibration clock's period. Delay line delay may be adjusted 1202 in calibration by a coarse speed select (e.g., 200 MHz versus 750 kHz), the line's regulated supply voltage (moderate resolution), capacitive load (moderate resolution), or by current-starved inverter bias (finest resolution), or a combination thereof. The regulated supply is bandgap referenced. In this example, the delay line 302 is the only circuit on the regulator supply, and the delay line presents a largely constant current load to the regulator after the delay line is calibrated. Failure detection logic 316 is on the digital supply VDDA.

Figure 7:
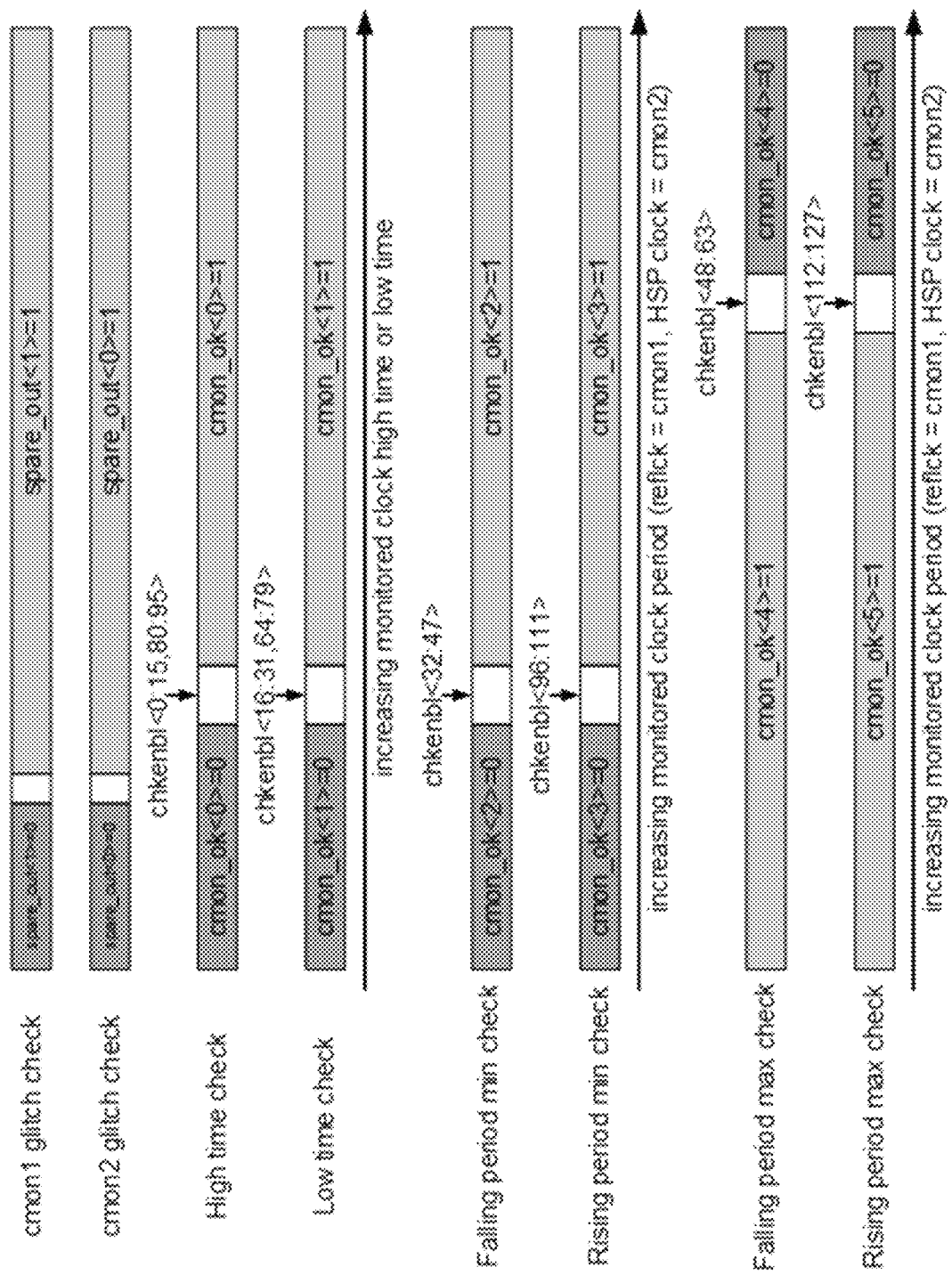
FIG. 7 is a diagram illustrating some examples of clock monitor trip control and status bit assignments.

In this example, FIG. 7 shows some examples of clock monitor trip control and status bit assignments. Following CMON delay line calibration, high time trip, low time trip, and period trip values 320 may be adjusted using chkenbl<127:0>. High time, low time and period checks are functions of the thermometer-encoded trip busses indicated in FIGS. 5 and 6. To adjust a trip time (e.g., High time check), the asserted bits of the associated thermometer trip busses (e.g., chkenbl<0:15> and chkenbl<80:95>) are adjusted according to a pin list in Table 2. Simulation such as a simulation using the AEMC ABM may provide one of skill additional insight into how trip thresholds vary as a function of these trip busses.

TABLE 2

CMON Pin List

| Block | #Bits | AEMC Signal Name | Notes |
|---|---|---|---|
| AEMC_TOP | 1 | vdd18 | |
| AEMC_TOP | 1 | vdda | |
| AEMC_TOP | 1 | vssa | |
| CMON1 | 1 | cmon1_clkin | |
| CMON1 | 1 | cmon1_clkout | |
| CMON1 | 16 | cmon1_vbgtc<15:0> | |
| CMON1 | 16 | cmon1_vddregsel<15:0> | |
| CMON1 | 3 | cmon1_speed<2:0> | |
| CMON1 | 128 | cmon1_chkenbl<127:0> | |
| CMON1 | 16 | cmon1_cload<15:0> | |
| CMON1 | 16 | cmon1_ctrlpsel<15:0> | |
| CMON1 | 16 | cmon1_ctrlnsel<15:0> | |
| CMON1 | 1 | cmon1_pdown | |
| CMON1 | 1 | cmon1_ok<0> | EMC_Cmon_hspclk_hitime_ok |
| CMON1 | 1 | cmon1_ok<1> | EMC_Cmon_hspclk_lowtime_ok |
| CMON1 | 1 | cmon1_ok<2> | EMC_Cmon_hspclk_falling_period_min_ok |
| CMON1 | 1 | cmon1_ok<3> | EMC_Cmon_hspclk_rising_period_min_ok |
| CMON1 | 1 | cmon1_ok<4> | EMC_Cmon_hspclk_falling_period_max_ok |
| CMON1 | 1 | cmon1_ok<5> | EMC_Cmon_hspclk_rising_period_max_ok |
| CMON2 | 1 | cmon2_clkin | |
| CMON2 | 1 | cmon2_clkout | |
| CMON2 | 16 | cmon2_vbgtc<15:0> | |
| CMON2 | 16 | cmon2_vddregsel<15:0> | |
| CMON2 | 3 | cmon2_speed<2:0> | |
| CMON2 | 128 | cmon2_chkenbl<127:0> | |
| CMON2 | 16 | cmon2_cload<15:0> | |
| CMON2 | 16 | cmon2_ctrlpsel<15:0> | |
| CMON2 | 16 | cmon2_ctrlnsel<15:0> | |
| CMON2 | 1 | cmon2_pdown | |
| CMON2 | 1 | cmon2_ok<0> | EMC_Cmon_refclk_hitime_ok |
| CMON2 | 1 | cmon2_ok<1> | EMC_Cmon_refclk_lowtime_ok |
| CMON2 | 1 | cmon2_ok<2> | EMC_Cmon_refclk_falling_period_min_ok |
| CMON2 | 1 | cmon2_ok<3> | EMC_Cmon_refclk_rising_period_min_ok |
| CMON2 | 1 | cmon2_ok<4> | EMC_Cmon_refclk_falling_period_max_ok |
| CMON2 | 1 | cmon2_ok<5> | EMC_Cmon_refclk_rising_period_max_ok |
| SPARE | 16 | spare_in<15:0> | |
| SPARE | 16 | spare_out<15:0> | Spare_out<1> used for glitch check |

In this example, clock monitor performance is dependent on its single-temperature calibration. Changes in delay line delay 338 in the presence of temperature and power supply voltage variation may cause a shift in trip thresholds after calibration. One of skill may accordingly check for compliance with desired performance metrics after calibration.

In some embodiments, CMON high time 332, low time 334, and period 322 trip thresholds are programmable 1202 over a limited range, relative to a target calibration period. After calibration, a clock high time, low time or period that is greater than or less than the programmed trip threshold will be detected and result in the de-assertion of the associated ok bit. In this example, the ranges are as follows: a minimum CMON high or low trip threshold is at most 35% of the target calibration period, a maximum CMON high or low trip threshold is at least 65% of the target calibration period, a minimum CMON period trip threshold is at most 85% of the target calibration period, and a maximum CMON period trip threshold is at least 115% of the target calibration period.

In this example, the AEMC has no timing requirements, in part because the AEMC circuitry is largely combinatorial, and in part because each CMON's small number of flip-flops are all clocked off the same monitored clock. Setup and hold times are not a concern in this signaling path.

Figure 8:
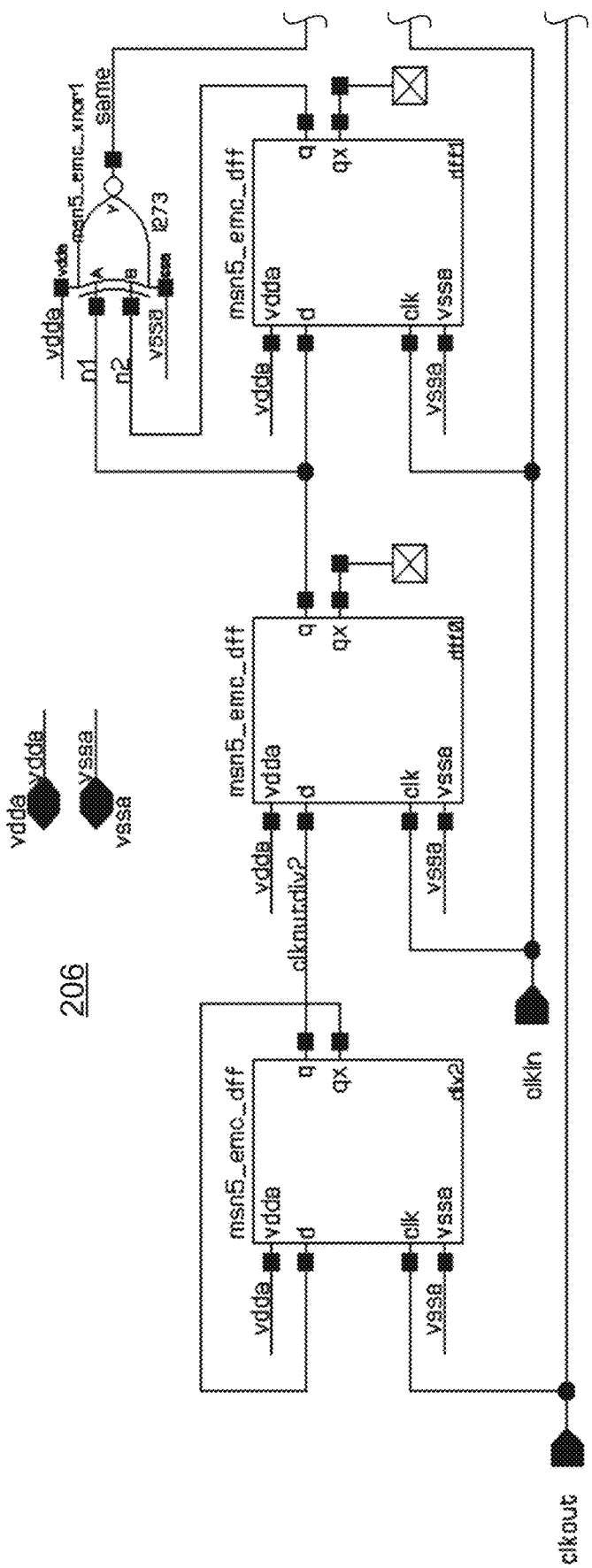
FIGS. 8 and 9 together form a circuit diagram illustrating a glitch detection circuit.
Figure 9:
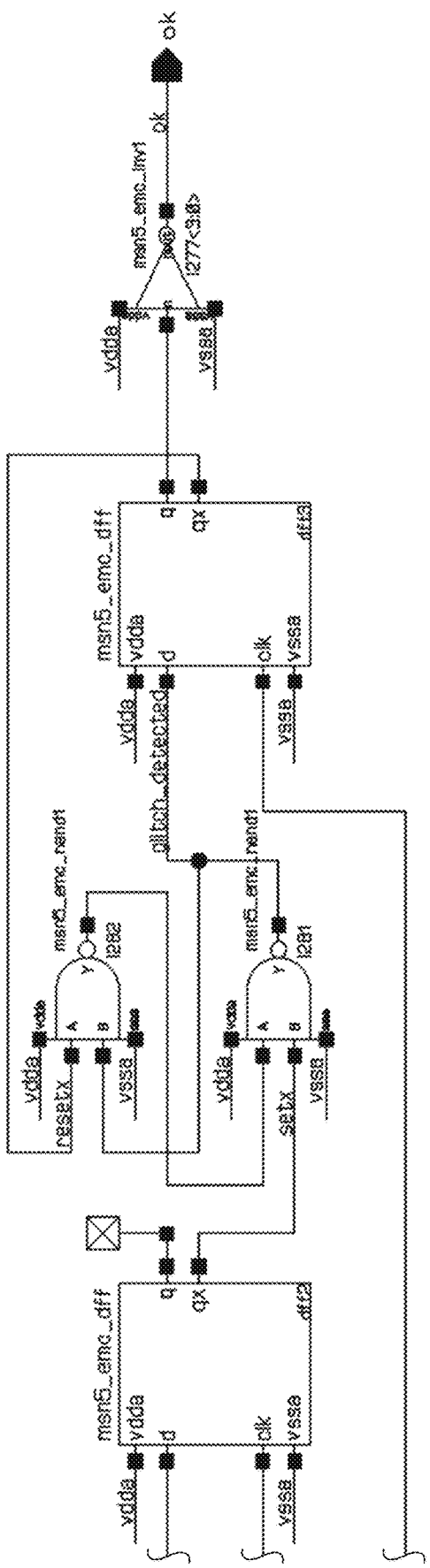
Figure 10:
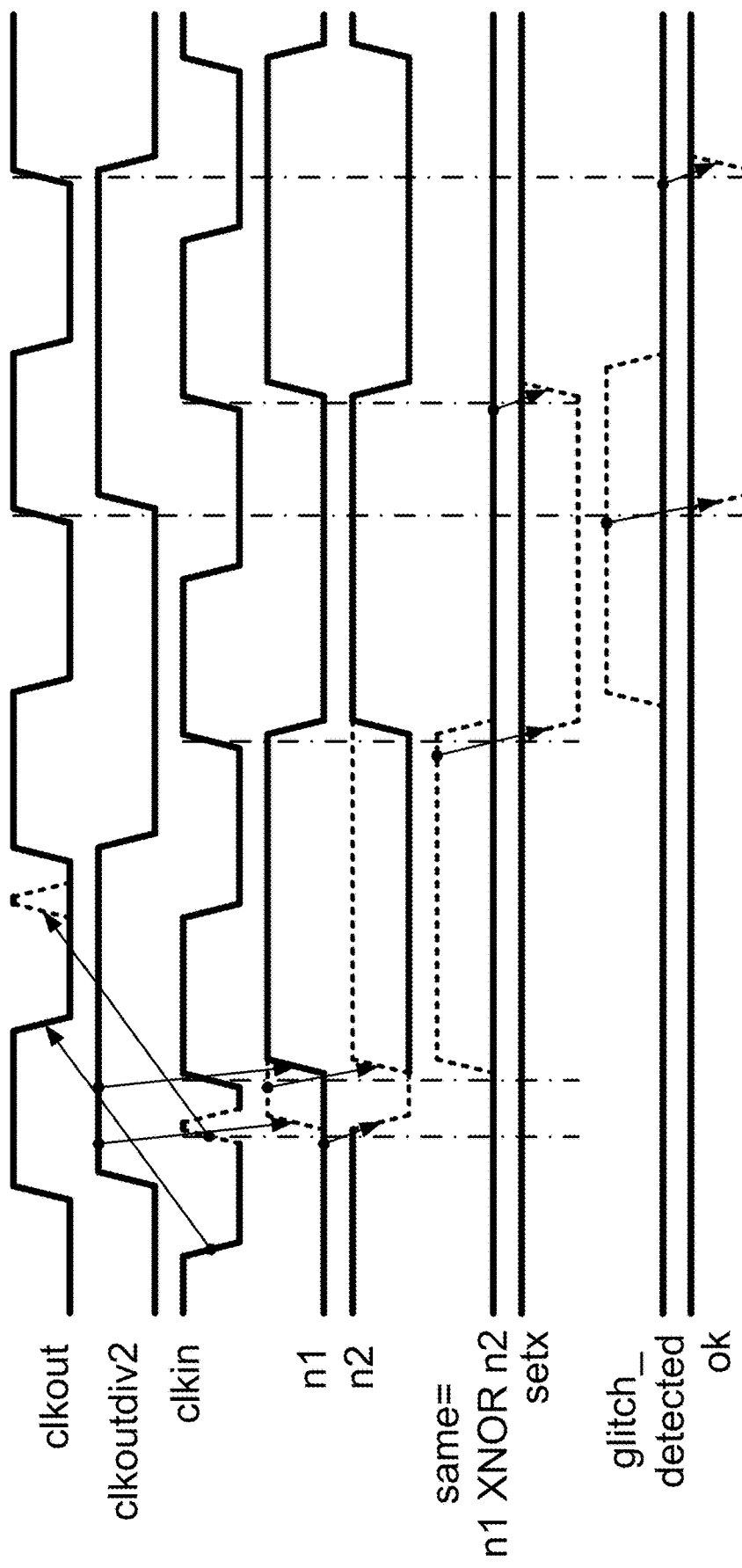
FIG. 10 is a timing diagram illustrating glitch detection.

In some embodiments, a supplementary glitch detection circuit 206 detects very narrow clock glitches 208 and indicates their detection by de-asserting the associated clock monitor's ok<0> output. FIGS. 8 and 9 show an example glitch detection circuit 206. FIG. 10 shows a corresponding glitch detection timing diagram.

A clock monitor 600 may include or be supplemented with logic for the detection of narrow glitches 208 that may escape detection by the primary delay-line based CMON. In this example, the glitch detection circuit 206 simultaneously monitors the input of the CMON delay line 302 via the glitch detector's clkin input and an output of the CMON delay line via the glitch detector's clkout input. The glitch monitor 206 detects and flags any detected narrow glitch that disappears before reaching the output of the CMON delay line.

As illustrated in FIG. 10, the CMON's delay line 302 filters some glitches. A narrow clkin glitch is filtered by the delay line and does not show up at clkout. The glitch detection circuit 206 of FIGS. 8 and 9 depends on and exploits this behavior. When there is no glitch on clkin, clkin will alternately sample a 1 and a 0 on clkoutdiv2. The output of an XNOR in FIG. 8 will then be low and remain low, and ok output will be high and remain high. But if there is a glitch, this will result in consecutive rising edges on clkin to sample the same level on clkoutdiv2. Thus, the glitch is detected, and ok goes low for one clkout cycle.

Some embodiments include or use a clock monitor circuit 204, including a plurality of delay cells 312. Each delay cell includes a delay portion 314 electronically coupled to a comparator portion 316. The delay portions are connected in series to form a delay line 302. The delay line is configured to generate 1204 an array 304 of delayed clock signals 306 from a monitored clock signal 210. Each comparator portion 316 is configured to perform a comparison which compares 1208 a delayed clock signal to an expected value 320. Each comparator portion is also configured to output 1210 a failure detection signal corresponding to a result of the comparison.

In some embodiments, the monitored clock signal has a period 322, and the delayed clock signals include low-to-high transitions 324 that are substantially evenly distributed throughout the clock period and high-to-low transitions 324 that are substantially evenly distributed throughout the clock period. As used herein, a set of N delayed clock edges are "substantially evenly distributed" throughout a clock period P when each delayed clock edge location in the period at an integer multiple kP/N (k=0, 1, 2, . . . N) has at least one clock edge no more than P/8N away.

In some embodiments, the array 304 of delayed clock signals includes at least 96 delayed clock signals and no more than 112 delayed clock signals.

Some embodiments combine the clock monitor circuit 204 with a device 102 having a power supply 216. The power supply has a voltage regulator 218. The voltage regulator provides a delay line 302 supply voltage 220, and the delay line is the only circuit connected to receive the delay line supply voltage.

Some embodiments combine the clock monitor circuit 204 with a device 102 having a power supply 216. The power supply provides a comparator supply voltage 220, and the comparator portions 316 are connected to receive the comparator supply voltage.

In some embodiments, at least one comparator portion 316 includes a programmable enable signal 326 that is defined at least in part relative to the expected value 320 used in the comparison, and the comparator portion is configured to output a failure detection signal 318 based on the enable signal and on the result of the comparison.

Some embodiments combine the clock monitor circuit 204 with a glitch detection circuit 206 which is configured to detect narrow glitches in the monitored clock signal. As used herein with respect to clock signal glitches, "narrow" is defined as 2% or less of the clock period, and "very narrow" is defined as 1% or less of the clock period.

In some embodiments, the clock monitor circuit 204 receives the monitored clock signal on a clock-in line 328 and emits the monitored clock signal on a clock-out line 330. This clock monitor circuit exhibits a lack of glitch propagation in that a narrow glitch on the clock-in line does not propagate to the clock-out line, and a glitch detection circuit 206 is configured to detect narrow glitches based at least in part on the lack of glitch propagation.

Some embodiments are further characterized in at least one of the following ways: at least one comparator portion 316 is configured to output 1210 a signal corresponding to a result of the comparison which indicates that a high time 332 of the monitored clock signal is greater than an expected high time; at least one comparator portion 316 is configured to output 1210 a signal corresponding to a result of the comparison which indicates that a high time 332 of the monitored clock signal is less than an expected high time; at least one comparator portion 316 is configured to output 1210 a signal corresponding to a result of the comparison which indicates that a low time 334 of the monitored clock signal is greater than an expected low time; at least one comparator portion 316 is configured to output 1210 a signal corresponding to a result of the comparison which indicates that a low time 334 of the monitored clock signal is less than an expected low time; at least one comparator portion 316 is configured to output 1210 a signal corresponding to a result of the comparison which indicates that a period 322 of the monitored clock signal is greater than an expected period; or at least one comparator portion 316 is configured to output 1210 a signal corresponding to a result of the comparison which indicates that a period 322 of the monitored clock signal is less than an expected period.

Some embodiments combine the clock monitor circuit 204 with a device 102 having a fuse set 214 which includes fuses or antifuses or both, and the expected values 320 are stored in the fuse set.

In some embodiments, each expected value 320 represents one of the following: a high state is expected, a low state is expected, or no particular state is expected.

Some embodiments are further characterized in at least one of the following ways: the clock monitor circuit 204 consumes less than 0.300 mW power while the monitored clock signal has a frequency of at least 200 MHz; or the clock monitor circuit 204 consumes less than 0.050 mW power while the monitored clock signal has a frequency of at least 750 kHz.

Some embodiments combine the clock monitor circuit 204 with a temperature monitor circuit, voltage monitor circuit, or other environmental monitor circuit.

Some embodiments combine the clock monitor circuit 204 with a device 102 having a digital memory 112 and a processor 110, the device including at least one of the following: a video gaming system; a laptop computer; a workstation computer; a server computer; a tablet computer; a smartphone; a router; a gateway; a firewall; an intrusion detection system; or a security information and event management system. These devices are each referred to herein by name and by reference numeral 102, as the disclosure for system or device 102 in combination with the name thereof is sufficient for one of skill to understand what particular device or system is intended.

Some embodiments provide or use a device 102 which includes: a first clock 212 having a first clock period 322 and configured to emit a first monitored clock signal 210; a second clock 212 having a second clock period 322 which is different from the first clock period, the second clock configured to emit a second monitored clock signal 210; a first clock monitor circuit 204 including a first plurality of delay cells, each delay cell including a delay portion coupled to a respective comparator portion, the delay portions connected in series to form a first delay line, the first delay line configured to generate a first array of delayed clock signals from the first monitored clock signal, each comparator portion configured to perform a comparison which compares a delayed clock signal from the first array to an expected value from a first set of expected values, each comparator portion also configured to output a failure detection signal corresponding to a result of the comparison; and a second clock monitor circuit 204 including a second plurality of delay cells, each delay cell including a delay portion coupled to a respective comparator portion, the delay portions connected in series to form a second delay line, the second delay line configured to generate a second array of delayed clock signals from the second monitored clock signal, each comparator portion configured to perform a comparison which compares a delayed clock signal from the second array to an expected value from a second set of expected values, each comparator portion also configured to output a failure detection signal corresponding to a result of the comparison.

In some embodiments, such a device with two or more clock monitor circuits 204 also includes a first glitch detection circuit 206 which is configured to detect narrow glitches in the first monitored clock signal, and a second glitch detection circuit 206 which is configured to detect narrow glitches in the second monitored clock signal. Here, as in other examples, "narrow" may be replaced by "very narrow" or vice versa to produce additional examples.

Other system and device embodiments are also described herein, either directly or derivable as versions of described processes or configured media, duly informed by the extensive discussion herein of computing hardware.

Although specific clock monitoring architecture examples are shown in the Figures, an embodiment may depart from those examples. For instance, items shown in different Figures may be included together in an embodiment, items shown in a Figure may be omitted, functionality shown in different items may be combined into fewer items or into a single item, items may be renamed, or items may be connected differently to one another.

Examples are provided in this disclosure to help illustrate aspects of the technology, but the examples given within this document do not describe all of the possible embodiments. A given embodiment may include additional or different technical features or other functionalities, and may otherwise depart from the examples provided herein.

Processes (a.k.a. Methods)

Figure 12:
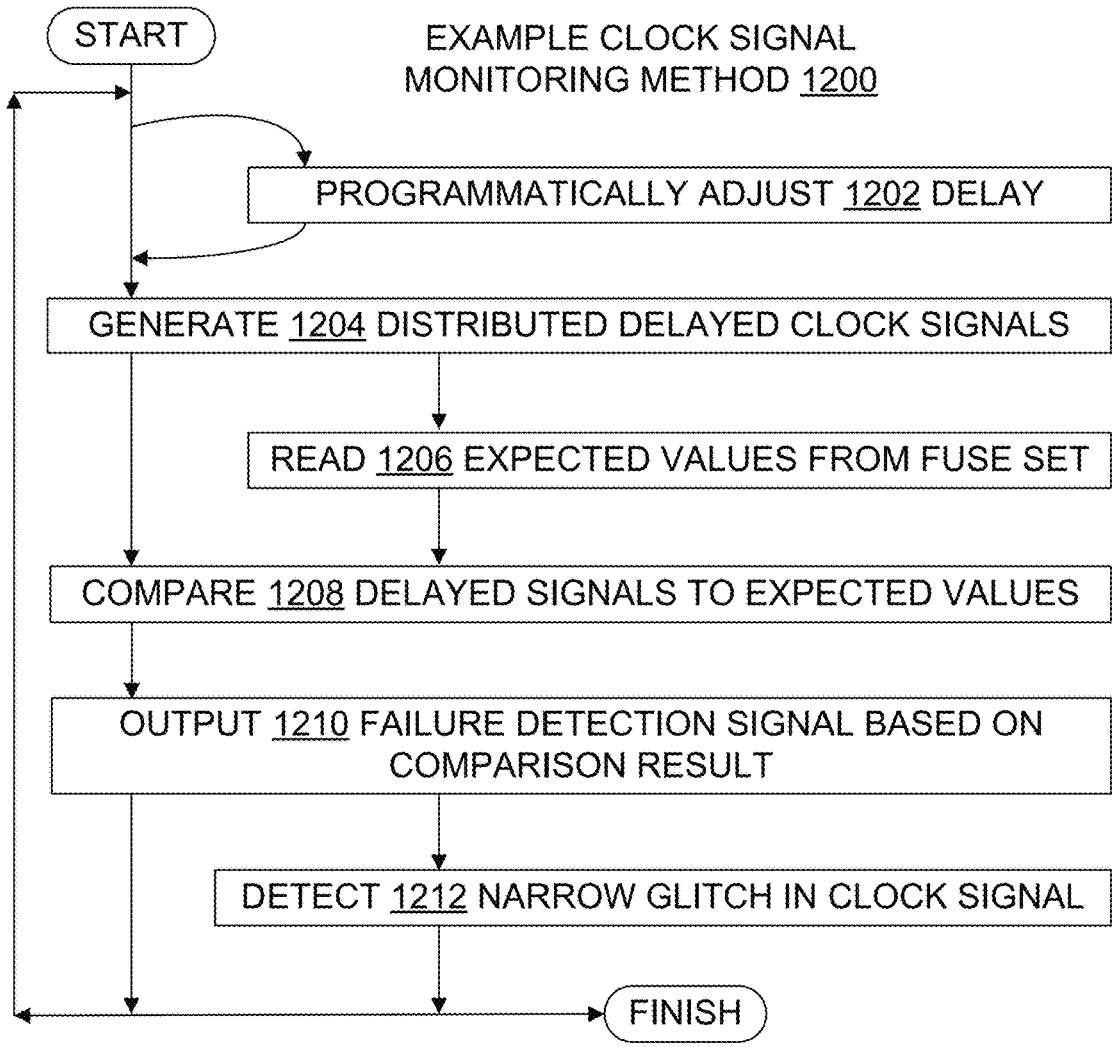
FIG. 12 is a flowchart illustrating steps in some clock monitoring methods.

A flowchart in FIG. 12 illustrates operational sequences, which may be part of method embodiments or may be performed by system or device embodiments, for example. The timing diagram in FIG. 10 also informs one of skill about method embodiments. Indeed, circuit diagrams and schematics also provide one of skill with information about methods (which may also be referred to as "processes" in the legal sense of that word) that are suitable for use during operation of a system or device which has innovative functionality taught herein.

In a given embodiment zero or more illustrated steps of a method may be repeated, perhaps with different parameters or data to operate on. Steps in an embodiment may also be done in a different order than the top-to-bottom order that is laid out in FIG. 12. Steps may be performed serially, in a partially overlapping manner, or fully in parallel. In particular, the order in which flowchart 1200 action items are traversed to indicate the steps performed during a method may vary from one performance of the method to another performance of the method. The flowchart traversal order may vary from one method embodiment to another method embodiment. Operational sequences may differ from those shown in FIG. 12. Steps may also be omitted, combined, renamed, regrouped, or otherwise depart from the illustrated flow, provided that the method performed is operable and conforms to at least one claim.

Some embodiments use or provide a method for clock signal monitoring. Some methods include the following steps performed automatically and proactively: generating 1204 from a monitored clock signal 210 a plurality of delayed clock signals 306, the monitored clock signal having a period 322, the delayed clock signals having respective transitions 324 which are distributed substantially evenly in time across the monitored clock signal period; comparing 1208 the delayed clock signals to at least respective expected values 320 to produce a comparison result; and outputting 1210 a result signal based on the comparison result.

Some embodiments include detecting 1212 a very narrow glitch 208 in the monitored clock signal. Some detect 1212 a narrow glitch 208.

Some embodiments include reading 1206 the expected values 320 from a fuse set 214 which includes fuses or antifuses or both.

Some embodiments include programmatically adjusting 1202 a delay 338 of a delay line 302 by at least one of the following: changing how many of one or more bandgap currents are coupled to an input of a current to a voltage converter; changing a capacitive loading on one or more delay cells; or changing a drive strength of one or more delay cells.

Additional Examples and Observations

Additional support for the discussion of clock monitoring herein is provided under various headings. However, it is all intended to be understood as an integrated and integral part of the present disclosure's discussion of the contemplated embodiments.

One of skill will recognize that not every part of this disclosure, or any particular details therein, are necessarily required to satisfy legal criteria such as enablement, written description, or best mode. Any apparent conflict with any other patent disclosure, even from the owner of the present innovations, has no role in interpreting the claims presented in this patent disclosure. With this understanding, which pertains to all parts of the present disclosure, additional examples and observations are offered.

With the benefit of teachings provided herein, one of skill will appreciate the power consumption, flexibility, and precision of clock monitor circuits 204. Clock monitor circuits 204 may be compared favorably, for example, to monitoring approaches that utilize a ring-oscillator and a counter controlled by a monitored clock.

Technical Character

The technical character of embodiments described herein will be apparent to one of ordinary skill in the art, and will also be apparent in several ways to a wide range of attentive readers. Some embodiments address technical activities such as monitoring 1200 clock signal 210 periods 322, high times 332, or low times 334, and detecting 1212 glitches 208 in clock signals, which are each an activity deeply rooted in computing technology. Some of the technical mechanisms discussed include, e.g., clock monitor circuits 204, glitch detection circuits 206, fuse sets 214, power supplies 216, power regulators 218, and bandgap references 602. Some of the technical effects discussed include, e.g., detection of clock signal 210 departures from expected values 320, glitch detection 1212, low power consumption 310, and flexible accuracy and targeting through programming 1202 and through varying the number of stages 314. Thus, purely mental processes and activities limited to pen-and-paper are clearly excluded. Other advantages based on the technical characteristics of the teachings will also be apparent to one of skill from the description provided.

Some embodiments described herein may be viewed by some people in a broader context. For instance, concepts such as efficiency, reliability, or security may be deemed relevant to a particular embodiment. However, it does not follow from the availability of a broad context that exclusive rights are being sought herein for abstract ideas; they are not. Rather, the present disclosure is focused on providing appropriately specific embodiments whose technical effects fully or partially solve particular technical problems, such as how to detect tampering with a device's internal clock signal, and other technical problems addressed at least in part by claimed embodiments. Other devices, systems, and processes involving efficiency, reliability, or security are outside the present scope. Accordingly, vagueness, mere abstractness, lack of technical character, and accompanying proof problems are also avoided under a proper understanding of the present disclosure.

Additional Combinations and Variations

Any of these combinations of code, data structures, logic, components, communications, signals, and/or their functional equivalents may also be combined with any of the systems and their variations described above. A process may include any steps described herein in any subset or combination or sequence which is operable. Each variant may occur alone, or in combination with any one or more of the other variants. Each variant may occur with any of the processes and each process may be combined with any one or more of the other processes. Each process or combination of processes, including variants, may be combined with any of the configured storage medium combinations and variants described above.

More generally, one of skill will recognize that not every part of this disclosure, or any particular details therein, are necessarily required to satisfy legal criteria such as enablement, written description, or best mode. Also, embodiments are not limited to the particular motivating examples, operating environments, time period examples, pinouts, circuit schematics, circuit layouts, timing diagrams, data selections, naming conventions, notations, control flows, or other implementation choices described herein. Any apparent conflict with any other patent disclosure, even from the owner of the present innovations, has no role in interpreting the claims presented in this patent disclosure.

Acronyms, Abbreviations, Names, and Symbols

Some acronyms, abbreviations, names, and symbols are defined below. Others are defined elsewhere herein, may be inferred from those given herein, or do not require definition here in order to be understood by one of skill.

ALU: arithmetic and logic unit
API: application program interface
BIOS: basic input/output system
Chk: check
Cload: Load Capacitance selection; this bus is more appropriately called cload_sel
CPU: central processing unit
ctrlpn (Equation 1): real number corresponding to the ctrlpsel bus setting
Ctrlpsel: delay element controlp and controln selection
Enbl: enable
FPGA: field-programmable gate array
FPU: floating point processing unit
GPU: graphical processing unit
IaaS or IAAS: infrastructure-as-a-service
ID: identification or identity
LAN: local area network
nominal PV: nominal semiconductor Process and system power supply Voltage
OS: operating system
PaaS or PAAS: platform-as-a-service
RAM: random access memory
ROM: read only memory
Sel: select
tempco (Equation 1): temperature coefficient
TPU: tensor processing unit
UEFI: Unified Extensible Firmware Interface
Vbgtc: Bandgap Voltage Temperature Coefficient selection; this bus is more appropriately called tempco_sel
Vddreg: Voltage regulator voltage
Vddreg_sel: voltage regulator voltage selection
WAN: wide area network Some Additional Terminology Reference is made herein to exemplary embodiments such as those illustrated in the drawings, and specific language is used herein to describe the same. But alterations and further modifications of the features illustrated herein, and additional technical applications of the abstract principles illustrated by particular embodiments herein, which would occur to one skilled in the relevant art(s) and having possession of this disclosure, should be considered within the scope of the claims.

The meaning of terms is clarified in this disclosure, so the claims should be read with careful attention to these clarifications. Specific examples are given, but those of skill in the relevant art(s) will understand that other examples may also fall within the meaning of the terms used, and within the scope of one or more claims. Terms do not necessarily have the same meaning here that they have in general usage (particularly in non-technical usage), or in the usage of a particular industry, or in a particular dictionary or set of dictionaries. Reference numerals may be used with various phrasings, to help show the breadth of a term. Omission of a reference numeral from a given piece of text does not necessarily mean that the content of a Figure is not being discussed by the text. The inventor asserts and exercises the right to specific and chosen lexicography. Quoted terms are being defined explicitly, but a term may also be defined implicitly without using quotation marks. Terms may be defined, either explicitly or implicitly, here in the Detailed Description and/or elsewhere in the application file.

A "computer system" (a.k.a. "computing system") may include, for example, one or more servers, motherboards, processing nodes, laptops, tablets, personal computers (portable or not), personal digital assistants, smartphones, smartwatches, smartbands, cell or mobile phones, other mobile devices having at least a processor and a memory, video game systems, augmented reality systems, holographic projection systems, televisions, wearable computing systems, and/or other device(s) providing one or more processors controlled at least in part by instructions. The instructions may be in the form of firmware or other software in memory and/or specialized circuitry.

A "processor" is a thread-processing unit, such as a core in a simultaneous multithreading implementation. A processor includes hardware. A given chip may hold one or more processors. Processors may be general purpose, or they may be tailored for specific uses such as vector processing, graphics processing, signal processing, floating-point arithmetic processing, encryption, I/O processing, machine learning, and so on.

"Kernels" include operating systems, hypervisors, virtual machines, BIOS or UEFI code, and similar hardware interface software.

"Code" means processor instructions, data (which includes constants, variables, and data structures), or both instructions and data. "Code" and "software" are used interchangeably herein. Executable code, interpreted code, and firmware are some examples of code.

"Program" is used broadly herein, to include applications, kernels, drivers, interrupt handlers, firmware, state machines, libraries, and other code written by programmers (who are also referred to as developers) and/or automatically generated.

A "routine" is a callable piece of code which typically returns control to an instruction just after the point in a program execution at which the routine was called. Depending on the terminology used, a distinction is sometimes made elsewhere between a "function" and a "procedure": a function typically returns a value, while a procedure does not. As used herein, "routine" includes both functions and procedures. A routine may have code that returns a value (e.g., sin(x)) or it may simply return without also providing a value (e.g., void functions).

"Service" means a consumable program offering, in a cloud computing environment or other network or computing system environment, which provides resources to multiple programs or provides resource access to multiple programs, or does both.

"Cloud" means pooled resources for computing, storage, and networking which are elastically available for measured on-demand service. A cloud may be private, public, community, or a hybrid, and cloud services may be offered in the form of infrastructure as a service (IaaS), platform as a service (PaaS), software as a service (SaaS), or another service. Unless stated otherwise, any discussion of reading from a file or writing to a file includes reading/writing a local file or reading/writing over a network, which may be a cloud network or other network, or doing both (local and networked read/write). A cloud may also be referred to as a "cloud environment" or a "cloud computing environment".

As used herein, "include" allows additional elements (i.e., includes means comprises) unless otherwise stated.

"Optimize" means to improve, not necessarily to perfect. For example, it may be possible to make further improvements in a program or an algorithm or a circuit which has been optimized.

"Process" is sometimes used herein as a term of the computing science arts, and in that technical sense encompasses computational resource users, which may also include or be referred to as coroutines, threads, tasks, interrupt handlers, application processes, kernel processes, procedures, or object methods, for example. As a practical matter, a "process" is the computational entity identified by system utilities such as Windows® Task Manager, Linux® ps, or similar utilities in other operating system environments (marks of Microsoft Corporation, Linus Torvalds, respectively). "Process" is also used herein as a patent law term of art, e.g., in describing a process claim as opposed to a system claim or an article of manufacture (configured storage medium) claim. Similarly, "method" is used herein at times as a technical term in the computing science arts (a kind of "routine") and also as a patent law term of art (a "process"). "Process" and "method" in the patent law sense are used interchangeably herein. Those of skill will understand which meaning is intended in a particular instance, and will also understand that a given claimed process or method (in the patent law sense) may sometimes be implemented using one or more processes or methods (in the computing science sense).

"Automatically" means by use of automation (e.g., general purpose computing hardware configured by software for specific operations and technical effects discussed herein), as opposed to without automation. In particular, steps performed "automatically" are not performed by hand on paper or in a person's mind, although they may be initiated by a human person or guided interactively by a human person. Automatic steps are performed with a machine in order to obtain one or more technical effects that would not be realized without the technical interactions thus provided. Steps performed automatically are presumed to include at least one operation performed proactively.

One of skill understands that technical effects are the presumptive purpose of a technical embodiment. The mere fact that calculation is involved in an embodiment, for example, and that some calculations can also be performed without technical components (e.g., by paper and pencil, or even as mental steps) does not remove the presence of the technical effects or alter the concrete and technical nature of the embodiment, particularly in real-world embodiment implementations. Clock monitoring operations such as generating delayed signals 306, comparing samples to expected values 320, and many other operations discussed herein, are understood to be inherently digital. A human mind cannot interface directly with a monitored clock signal 210 to perform the clock monitoring steps taught herein. This would all be well understood by persons of skill in the art in view of the present disclosure.

"Computationally" likewise means a computing device (processor plus memory, at least) is being used, and excludes obtaining a result by mere human thought or mere human action alone. For example, doing arithmetic with a paper and pencil is not doing arithmetic computationally as understood herein. Computational results are faster, broader, deeper, more accurate, more consistent, more comprehensive, and/or otherwise provide technical effects that are beyond the scope of human performance alone. "Computational steps" are steps performed computationally. Neither "automatically" nor "computationally" necessarily means "immediately". "Computationally" and "automatically" are used interchangeably herein.

"Proactively" means without a direct request from a user. Indeed, a user may not even realize that a proactive step by an embodiment was possible until a result of the step has been presented to the user. Except as otherwise stated, any computational and/or automatic step described herein may also be done proactively.

Throughout this document, use of the optional plural "(s)", "(es)", or "(ies)" means that one or more of the indicated features is present. For example, "processor(s)" means "one or more processors" or equivalently "at least one processor".

For the purposes of United States law and practice, use of the word "step" herein, in the claims or elsewhere, is not intended to invoke means-plus-function, step-plus-function, or 35 United State Code Section 112 Sixth Paragraph/Section 112(f) claim interpretation. Any presumption to that effect is hereby explicitly rebutted.

For the purposes of United States law and practice, the claims are not intended to invoke means-plus-function interpretation unless they use the phrase "means for". Claim language intended to be interpreted as means-plus-function language, if any, will expressly recite that intention by using the phrase "means for". When means-plus-function interpretation applies, whether by use of "means for" and/or by a court's legal construction of claim language, the means recited in the specification for a given noun or a given verb should be understood to be linked to the claim language and linked together herein by virtue of any of the following: appearance within the same block in a block diagram of the figures, denotation by the same or a similar name, denotation by the same reference numeral, a functional relationship depicted in any of the figures, a functional relationship noted in the present disclosure's text. For example, if a claim limitation recited a "zac widget" and that claim limitation became subject to means-plus-function interpretation, then at a minimum all structures identified anywhere in the specification in any figure block, paragraph, or example mentioning "zac widget", or tied together by any reference numeral assigned to a zac widget, or disclosed as having a functional relationship with the structure or operation of a zac widget, would be deemed part of the structures identified in the application for zac widgets and would help define the set of equivalents for zac widget structures.

Whenever reference is made to data or instructions, it is understood that these items configure a computer-readable memory and/or computer-readable storage medium, thereby transforming it to a particular article, as opposed to simply existing on paper, in a person's mind, or as a mere signal being propagated on a wire, for example. For the purposes of patent protection in the United States, a memory or other computer-readable storage medium is not a propagating signal or a carrier wave or mere energy outside the scope of patentable subject matter. No claim covers a signal per se or mere energy in the United States, and any claim interpretation that asserts otherwise in view of the present disclosure is unreasonable on its face. Unless expressly stated otherwise in a claim granted outside the United States, a claim does not cover a signal per se or mere energy. Some claims are, quite properly, directed to circuits that take electronic signals as inputs, or produce electronic signals as outputs, or both. This does not mean signals themselves are being claimed.

An "embodiment" herein is an example. The term "embodiment" is not interchangeable with "the invention". Embodiments may freely share or borrow aspects to create other embodiments (provided the result is operable), even if a resulting combination of aspects is not explicitly described per se herein. Requiring each and every permitted combination to be explicitly and individually described is unnecessary for one of skill in the art, and would be contrary to policies which recognize that patent specifications are written for readers who are skilled in the art. Formal combinatorial calculations and informal common intuition regarding the number of possible combinations arising from even a small number of combinable features will also indicate that a large number of aspect combinations exist for the aspects described herein. Accordingly, requiring an explicit recitation of each and every combination would be contrary to policies calling for patent specifications to be concise and for readers to be knowledgeable in the technical fields concerned.

LIST OF REFERENCE NUMERALS

The following list is provided for convenience and in support of the drawing figures and as part of the text of the specification, which describe innovations by reference to multiple items. Items not listed here may nonetheless be part of a given embodiment. For better legibility of the text, a given reference number is recited near some, but not all, recitations of the referenced item in the text. The same reference number may be used with reference to different examples or different instances of a given item. The list of reference numerals is:

- 100 operating environment, also referred to as computing environment
- 102 computer system, also referred to as a "computational system" or "computing system", and when in a network may be referred to as a "node"
- 104 users, e.g., user of an enhanced system 202
- 106 peripherals
- 108 network generally, including, e.g., LANs, WANs, software-defined networks, clouds, and other wired or wireless networks
- 110 processor
- 112 computer-readable storage medium device, e.g., RAM, hard disks
- 114 removable configured computer-readable storage medium
- 116 instructions executable with processor; may be on removable storage media or in other memory (volatile or nonvolatile or both)

118 data
120 kernel(s), e.g., operating system(s), BIOS, UEFI, device drivers
122 tools, e.g., anti-virus software, firewalls, packet sniffer software, intrusion detection systems, intrusion prevention systems, other cybersecurity tools, debuggers, profilers, compilers, interpreters, decompilers, assemblers, disassemblers, source code editors, autocompletion software, simulators, fuzzers, repository access tools, version control tools, optimizers, collaboration tools, other software development tools and tool suites (including, e.g., integrated development environments), hardware development tools and tool suites, diagnostics, and so on
124 applications, e.g., word processors, web browsers, spreadsheets, games, email tools, commands
126 display; also referred to as "display device"
128 computing hardware not otherwise associated with a reference number 106, 108, 110, 112, 114, e.g., batteries
202 system or device 102 enhanced with clock monitoring functionality, e.g., functionality to perform any operation or operational sequence noted in any of the Figures and first described herein, or to utilize any circuit or an equivalent of any circuit that is first described herein
204 clock monitor circuit
206 glitch detection circuit
208 glitch in a monitored clock signal
210 monitored clock signal
212 monitored clock
214 set of one or more fuses or antifuses
216 power supply
218 voltage regulator
220 voltage
222 hardware not otherwise given a reference numeral
224 software not otherwise given a reference numeral
302 delay line
304 array of delayed clock signals
306 delayed clock signal
308 electric power
310 consumption of electric power; may refer to a consumption amount or to an action of consuming power
312 delay cell
314 delay portion of delay cell
316 comparator portion of delay cell
318 failure detection signal
320 expected value; also referred to as a "trip value"
322 clock period
324 transition in clock signal
326 enable signal
328 clock in signal line
330 clock out signal line
332 high time; amount of time signal spends in high state
334 low time; amount of time signal spends in low state
336 signal line generally
338 delay created by delay line 302
402 hardware security platform
404 security component
406 AEMC— Analog Environmental Monitor Circuit in example device
408 ECL— EMC Control Logic in example device
410 Fuse Communication Bus in example device
412 EMC— Environmental Monitor Circuit in example device
502— group of delay cells, also referred to as a delay cell "element"; FIG. 5 shows sixteen delay cells per element, but any number of delay cells may be grouped
600 CMON— an example clock monitor which may include, e.g., a clock monitor circuit, a glitch detection circuit, and other circuitry
602 bandgap reference
1200 flowchart; 1200 also refers to clock monitoring methods illustrated by or consistent with the FIG. 12 flowchart
1202 programmatically adjust delay line delay 338
1204 generate array of delayed clock signals
1206 electronically read an expected value, e.g., from a fuse set
1208 electronically compare a delayed clock signal or characteristic thereof to an expected value
1210 output a failure detection signal which is based on at least comparison 1208
1212 electronically detect a glitch 208 in a signal

CONCLUSION

In short, the teachings herein provide a variety of clock monitoring functionalities which operate in enhanced systems 202. A clock monitor circuit 204 detects 1208 departures from expected values 320 for one or more of a clock period 322, a clock high time duration 332, or a clock low time duration 334. A delay line 302 of the clock monitor circuit 204 is composed of delay portions 314 of delay cells 312. Each delay cell 312 also has a comparator portion 316 with logic to compare 1208 aspects 322, 332, 334 of a monitored clock signal 210 to corresponding expected values 320, and to output 1210 a failure detection signal 318 indicating whether the expected values 320 are met. Expected values 320 may be read 1206 from a fuse set 214. The delay 338 of the delay line 302 may be programmatically adjusted 1202. The clock monitor circuit 204 may be combined with a circuit 206 that detects 1212 narrow glitches 208 (or very narrow glitches 208) in the monitored clock signal 210. Devices 202 and systems 202 with one or more monitored clock signals 210, and methods 1200 of clock signal monitoring, are also described.

Embodiments are understood to also themselves include or benefit from tested and appropriate security controls and privacy controls such as the General Data Protection Regulation (GDPR), e.g., it is understood that appropriate measures should be taken to help prevent misuse of computing systems through the injection or activation of malware into user software. Use of the tools and techniques taught herein is compatible with use of such controls.

Although Microsoft technology is used in some motivating examples, the teachings herein are not limited to use in technology supplied or administered by Microsoft. Under a suitable license, for example, the present teachings could be embodied in software or services provided by other cloud service providers.

Although particular embodiments are expressly illustrated and described herein as processes, as configured storage media, or as systems, it will be appreciated that discussion of one type of embodiment also generally extends to other embodiment types. For instance, the descriptions of processes in connection with FIG. 12 also help describe configured storage media, and help describe the technical effects and operation of systems, devices, and circuits (articles of manufacture) like those discussed in connection with other Figures. It does not follow that limitations from one embodiment are necessarily read into another. In particular, processes are not necessarily limited to the data structures and arrangements presented while discussing systems or manufactures such as configured memories.

Those of skill will understand that implementation details may pertain to specific circuitry or programming, such as specific thresholds, comparisons, frequencies, architectures, utilizations, devices, and specific computing environments, and thus need not appear in every embodiment. Those of skill will also understand that program identifiers and some other terminology used in discussing details are implementation-specific and thus need not pertain to every embodiment. Nonetheless, although they are not necessarily required to be present here, such details may help some readers by providing context and/or may illustrate a few of the many possible implementations of the technology discussed herein.

With due attention to the items provided herein, including technical processes, technical effects, technical mechanisms, and technical details which are illustrative but not comprehensive of all claimed or claimable embodiments, one of skill will understand that the present disclosure and the embodiments described herein are not directed to subject matter outside the technical arts, or to any idea of itself such as a principal or original cause or motive, or to a mere result per se, or to a mental process or mental steps, or to a business method or prevalent economic practice, or to a mere method of organizing human activities, or to a law of nature per se, or to a naturally occurring thing or process, or to a living thing or part of a living thing, or to a mathematical formula per se, or to isolated software per se, or to a merely conventional computer, or to anything wholly imperceptible or any abstract idea per se, or to insignificant post-solution activities, or to any method implemented entirely on an unspecified apparatus, or to any method that fails to produce results that are useful and concrete, or to any preemption of all fields of usage, or to any other subject matter which is ineligible for patent protection under the laws of the jurisdiction in which such protection is sought or is being licensed or enforced.

Reference herein to an embodiment having some feature X and reference elsewhere herein to an embodiment having some feature Y does not exclude from this disclosure embodiments which have both feature X and feature Y, unless such exclusion is expressly stated herein. All possible negative claim limitations are within the scope of this disclosure, in the sense that any feature which is stated to be part of an embodiment may also be expressly removed from inclusion in another embodiment, even if that specific exclusion is not given in any example herein. The term "embodiment" is merely used herein as a more convenient form of "process, system, article of manufacture, configured computer readable storage medium, and/or other example of the teachings herein as applied in a manner consistent with applicable law." Accordingly, a given "embodiment" may include any combination of features disclosed herein, provided the embodiment is consistent with at least one claim.

Not every item shown in the Figures need be present in every embodiment. Conversely, an embodiment may contain item(s) not shown expressly in the Figures. Although some possibilities are illustrated here in text and drawings by specific examples, embodiments may depart from these examples. For instance, specific technical effects or technical features of an example may be omitted, renamed, grouped differently, repeated, instantiated in hardware and/or software differently, or be a mix of effects or features appearing in two or more of the examples. Functionality shown at one location may also be provided at a different location in some embodiments; one of skill recognizes that functionality modules can be defined in various ways in a given implementation without necessarily omitting desired technical effects from the collection of interacting modules viewed as a whole. Distinct steps may be shown together in a single box in the Figures, due to space limitations or for convenience, but nonetheless be separately performable, e.g., one may be performed without the other in a given performance of a method.

Reference has been made to the figures throughout by reference numerals. Any apparent inconsistencies in the phrasing associated with a given reference numeral, in the figures or in the text, should be understood as simply broadening the scope of what is referenced by that numeral. Different instances of a given reference numeral may refer to different embodiments, even though the same reference numeral is used. Similarly, a given reference numeral may be used to refer to a verb, a noun, and/or to corresponding instances of each, e.g., a processor 110 may process 110 instructions by executing them.

As used herein, terms such as "a", "an", and "the" are inclusive of one or more of the indicated item or step. In particular, in the claims a reference to an item generally means at least one such item is present and a reference to a step means at least one instance of the step is performed. Similarly, "is" and other singular verb forms should be understood to encompass the possibility of "are" and other plural forms, when context permits, to avoid grammatical errors or misunderstandings.

Headings are for convenience only; information on a given topic may be found outside the section whose heading indicates that topic.

All claims and the abstract, as filed, are part of the specification.

To the extent any term used herein implicates or otherwise refers to an industry standard, and to the extent that applicable law requires identification of a particular version of such as standard, this disclosure shall be understood to refer to the most recent version of that standard which has been published in at least draft form (final form takes precedence if more recent) as of the earliest priority date of the present disclosure under applicable patent law.

While exemplary embodiments have been shown in the drawings and described above, it will be apparent to those of ordinary skill in the art that numerous modifications can be made without departing from the principles and concepts set forth in the claims, and that such modifications need not encompass an entire abstract concept. Although the subject matter is described in language specific to structural features and/or procedural acts, it is to be understood that the subject matter defined in the appended claims is not necessarily limited to the specific technical features or acts described above the claims. It is not necessary for every means or aspect or technical effect identified in a given definition or example to be present or to be utilized in every embodiment. Rather, the specific features and acts and effects described are disclosed as examples for consideration when implementing the claims.

All changes which fall short of enveloping an entire abstract idea but come within the meaning and range of equivalency of the claims are to be embraced within their scope to the full extent permitted by law.

What is claimed is:

1. A clock monitor circuit, comprising a plurality of delay cells, each delay cell including a delay portion coupled to a comparator portion, the delay portions connected in series to form a delay line, the delay line configured to generate an array of delayed clock signals from a monitored clock signal, each comparator portion configured to perform a comparison which compares a delayed clock signal to an expected value for at least one of: a monitored clock signal period, a monitored clock signal high time duration, or a monitored clock signal low time duration, each comparator portion also configured to output a failure detection signal indicating whether the expected values are met.

2. The clock monitor circuit of claim 1, wherein the monitored clock signal has a period, and the delayed clock signals include low-to-high transitions that are substantially evenly distributed throughout the clock period and high-to-low transitions that are substantially evenly distributed throughout the clock period.

3. The clock monitor circuit of claim 1, wherein the array of delayed clock signals includes at least 96 clock signals and no more than 112 clock signals.

4. The clock monitor circuit of claim 1 in combination with a device having a power supply, the power supply having a voltage regulator, the voltage regulator providing a delay line supply voltage, and wherein the delay line is the only circuit connected to receive the delay line supply voltage.

5. The clock monitor circuit of claim 1 in combination with a device having a power supply, the power supply providing a comparator supply voltage, and wherein the comparator portions are connected to receive the comparator supply voltage.

6. The clock monitor circuit of claim 1, wherein at least one comparator portion includes a programmable enable signal that is defined at least in part relative to the expected value used in the comparison, and wherein the comparator portion is configured to output a failure detection signal based on the enable signal and on the result of the comparison.

7. The clock monitor circuit of claim 1 in combination with a glitch detection circuit which is configured to detect narrow glitches in the monitored clock signal.

8. The clock monitor circuit of claim 7, wherein the clock monitor circuit receives the monitored clock signal on a clock-in line and emits the monitored clock signal on a clock-out line, the clock monitor circuit exhibits a lack of glitch propagation in that a narrow glitch on the clock-in line does not propagate to the clock-out line, and the glitch detection circuit is configured to detect narrow glitches based at least in part on the lack of glitch propagation.

9. The clock monitor circuit of claim 1, further characterized in at least one of the following ways:
at least one comparator portion is configured to output a signal corresponding to a result of the comparison which indicates that a high time of the monitored clock signal is greater than an expected high time;
at least one comparator portion is configured to output a signal corresponding to a result of the comparison which indicates that a high time of the monitored clock signal is less than an expected high time;
at least one comparator portion is configured to output a signal corresponding to a result of the comparison which indicates that a low time of the monitored clock signal is greater than an expected low time;
at least one comparator portion is configured to output a signal corresponding to a result of the comparison which indicates that a low time of the monitored clock signal is less than an expected low time;
at least one comparator portion is configured to output a signal corresponding to a result of the comparison which indicates that a period of the monitored clock signal is greater than an expected period; or
at least one comparator portion is configured to output a signal corresponding to a result of the comparison which indicates that a period of the monitored clock signal is less than an expected period.

10. The clock monitor circuit of claim 1 in combination with a device having a fuse set which includes fuses or antifuses or both, and wherein the expected values are stored in the fuse set.

11. The clock monitor circuit of claim 1, wherein each expected value represents one of the following: a high state is expected, a low state is expected, or no particular state is expected.

12. The clock monitor circuit of claim 1, further characterized in at least one of the following ways:
the clock monitor circuit consumes less than 0.300 mW power while the monitored clock signal has a frequency of at least 200 MHz; or
the clock monitor circuit consumes less than 0.050 mW power while the monitored clock signal has a frequency of at least 750 kHz.

13. The clock monitor circuit of claim 1 coupled with an environmental monitor circuit.

14. The clock monitor circuit of claim 1, further characterized in that the clock monitor circuit receives a controlled voltage from a bandgap voltage supply.

15. A device comprising:
a first clock having a first clock period and configured to emit a first monitored clock signal;
a second clock having a second clock period which is different from the first clock period, the second clock configured to emit a second monitored clock signal;
a first clock monitor circuit including a first plurality of delay cells, each delay cell including a delay portion coupled to a respective comparator portion, the delay portions connected in series to form a first delay line, the first delay line configured to generate a first array of delayed clock signals from the first monitored clock signal, each comparator portion configured to perform a comparison which compares a delayed clock signal from the first array to an expected value from a first set of expected values for at least one of: a monitored clock signal period, a monitored clock signal high time duration, or a monitored clock signal low time duration, each comparator portion also configured to output a failure detection signal corresponding to a result of the comparison; and
a second clock monitor circuit including a second plurality of delay cells, each delay cell including a delay portion coupled to a respective comparator portion, the delay portions connected in series to form a second delay line, the second delay line configured to generate a second array of delayed clock signals from the second monitored clock signal, each comparator portion configured to perform a comparison which compares a delayed clock signal from the second array to an expected value from a second set of expected values, each comparator portion also configured to output a failure detection signal corresponding to a result of the comparison.

16. The device of claim 15, further comprising a first glitch detection circuit which is configured to detect narrow glitches in the first monitored clock signal, and a second glitch detection circuit which is configured to detect narrow glitches in the second monitored clock signal.

17. A method for clock signal monitoring, comprising:
generating from a monitored clock signal a plurality of delayed clock signals, the monitored clock signal having a period, the delayed clock signals having respective transitions which are distributed substantially evenly in time across the monitored clock signal period;

comparing the delayed clock signals to at least respective expected values for at least one of: a monitored clock signal period, a monitored clock signal high time duration, or a monitored clock signal low time duration to produce a comparison result; and outputting a result signal based on the comparison result.

18. The method of claim 17, further comprising detecting a very narrow glitch in the monitored clock signal.

19. The method of claim 17, further comprising reading the expected values from a fuse set which includes fuses or antifuses or both.

20. The method of claim 17, further comprising programmatically adjusting a delay of a delay line by at least one of the following:

changing a capacitive loading on one or more delay cells; or changing a drive strength of one or more delay cells.

* * * * *